United States Patent [19]
Griffing et al.

[11] 4,415,955
[45] Nov. 15, 1983

[54] IRRADIATION APPARATUS UTILIZING LINEAR RADIATION SOURCES

[75] Inventors: Bruce F. Griffing; Peter D. Johnson, both of Schenectady; Roger N. Johnson, Hagaman, all of N.Y.

[73] Assignee: General Electric Company, Schenectady, N.Y.

[21] Appl. No.: 276,137

[22] Filed: Jun. 22, 1981

[51] Int. Cl.³ .............................................. F21S 3/00
[52] U.S. Cl. ................................. 362/225; 313/638; 362/230; 362/263; 362/290; 362/342
[58] Field of Search ............... 362/225, 230, 263, 290, 362/325, 342, 354; 313/223, 227

[56] References Cited

U.S. PATENT DOCUMENTS

| | | | |
|---|---|---|---|
| 2,689,026 | 9/1954 | Zingone | 362/354 |
| 2,905,070 | 9/1959 | Gelb | 362/290 |
| 2,918,567 | 12/1959 | Leitz | 362/225 |
| 3,657,590 | 4/1972 | Johnson | 313/223 |

*Primary Examiner*—Donald P. Walsh
*Attorney, Agent, or Firm*—Julius J. Zaskalicky; James C. Davis, Jr.; Marvin Snyder

[57] ABSTRACT

Apparatus is disclosed for uniform exposure of a plurality of objects such as semiconductor wafers to radiation utilizing sources of radiation of linear configuration. The apparatus includes a baffle assembly of particular construction and constitution situated between the linear sources and the region to be irradiated.

14 Claims, 5 Drawing Figures

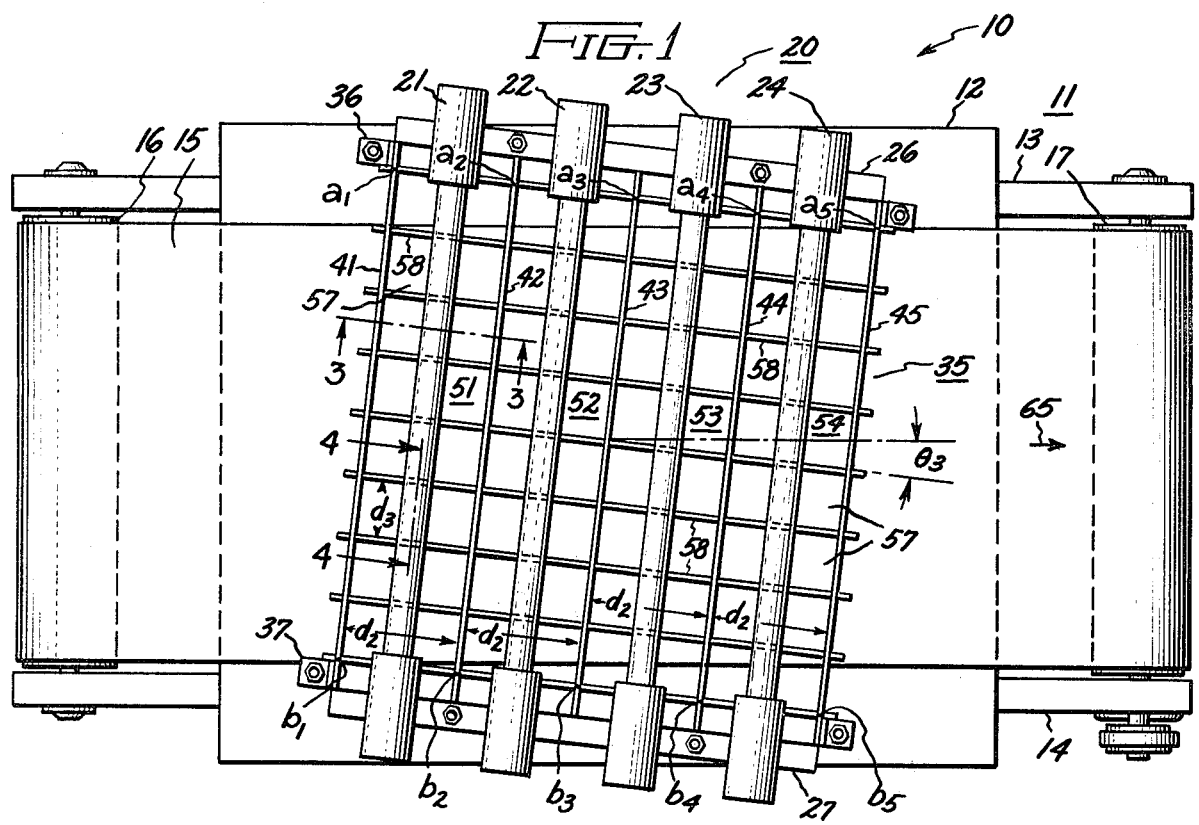
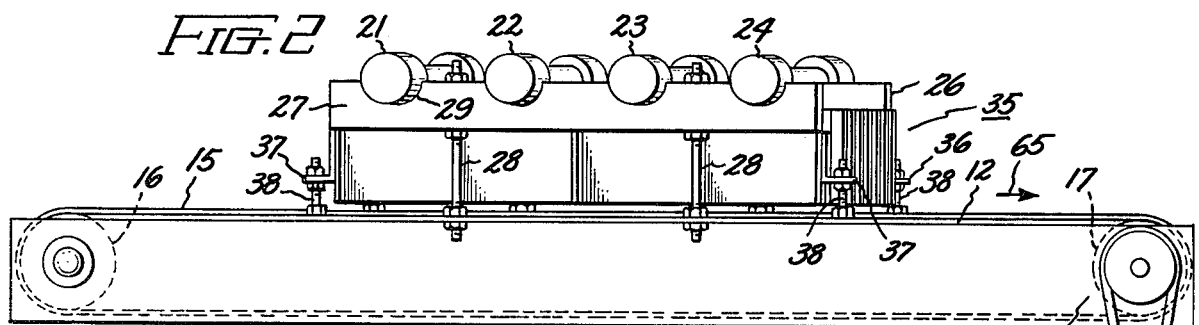
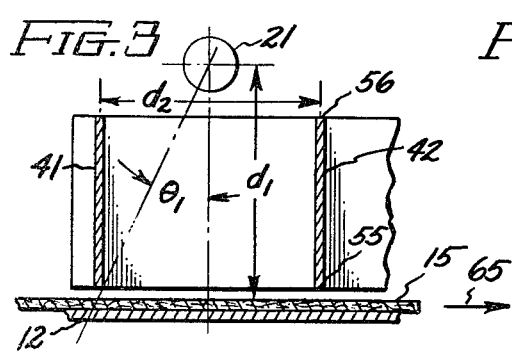
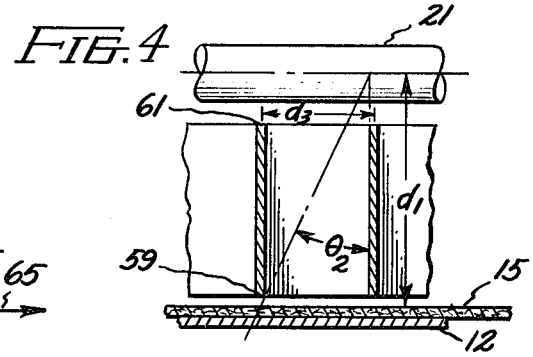
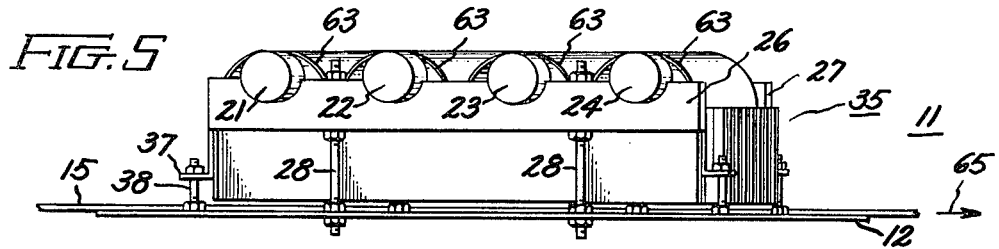

IRRADIATION APPARATUS UTILIZING LINEAR RADIATION SOURCES

The present invention relates in general to irradiation apparatus utilizing linear radiation sources and in particular to irradiation apparatus utilizing linear radiation sources for providing substantially uniform dosages of radiation to and over each of a plurality of objects, such as semiconductor wafers.

In the semiconductor industry, radiation responsive resists are commonly used in processes for patterning various films and layers of materials utilized in the fabrication of integrated circuits. In one such process, a thick bottom layer of a resist material, such as polymethyl methacrylate, is applied to the substrate or wafer of the integrated circuit to be processed and a thin top layer of another resist material, such as an azide resist, is provided over the bottom layer. The lower surface of the thick bottom layer of polymethyl methacrylate conforms to the topology of the wafer and the upper surface thereof is planar. The top layer of the two layer resist is exposed to a pattern of radiation to which it is sensitive and to which the bottom layer is not sensitive. The exposed portions of the top layer are removed by a suitable solvent or developer leaving retained portions of the top layer. Next, the bottom layer of resist is exposed through the openings in the top layer to radiation to which it is sensitive and to which the top layer is not sensitive. Thereafter, the exposed portions of the bottom layer are removed by a suitable solvent or developer leaving retained portions of the bottom layer which are then utilized in the processing of the wafer. The two layer technique described above utilizing a bottom layer of polymethyl methacrylate and a top layer of an azide resist, for example Shipley AZ1350, requires an ultraviolet source of radiation with wavelengths above 330 nanometers for the exposure of the top layer and also requires an ultraviolet source of radiation with wavelengths lying in the band of from about 190 to about 230 nanometers for exposure of the bottom layer of the polymethyl methacrylate. The top layer strongly absorbs this band of wavelengths and therefore provides good blockage thereof while the bottom layer is sensitive to this band of wavelengths. The radiation from any such ultraviolet source preferably should be uniform across the surface of the wafer to provide uniform dosage. In addition, the integrated angular distribution of radiation incident on the wafer should be uniform across the surface of the wafer. The latter requirement determines the edge profiles which are produced in the thick layer of polymethyl methacrylate resist after development. Also, the above requirements should be provided for a large number of wafers to be processed concurrently.

Heretofore, two level resistance exposure systems have utilized high pressure mercury-zenon or mercury vapor electric discharge lamps to provide the deep ultraviolet radiation. These lamps produce ultraviolet radiation extending over a wide band of frequencies and consequently require the utilization of filters to remove the unwanted wavelengths of radiation and provide radiation in the desired wavelengths. These lamps are inefficient in the production of radiation in the desired band of wavelengths thereby presenting the additional problem of disposal of waste heat. One source of radiation which provides radiation in the desired band of wavelengths and does not require filtering and which, in addition, is more efficient in the generation of radiation in the desired band of wavelengths is the lamp of U.S. Pat. No. 3,657,590 "High Intensity Far U.V. Radiation Source", assigned to the assignee of the present invention. However, the source of radiation of the lamp of this patent is linear in configuration and accordingly, conventional optics cannot be used to control the angular distribution of the radiation or its uniformity.

An object of the present invention is to provide irradiation apparatus utilizing linear radiation sources which provides uniform exposure of objects to the radiation therefrom.

Another object of the present invention is to provide irradiation apparatus utilizing linear radiation sources in which the uniformity and angle of incidence of the radiation therefrom is readily controllable.

A further object of the present invention is to provide irradiation apparatus utilizing linear radiation sources which provides uniform exposure of a plurality of objects to the radiation therefrom with speed and precision.

In carrying out the invention in an illustrative embodiment thereof, a planar surface is provided. Means are provided for irradiating an area of the planar surface of generally quadrangular outline bounded by a pair of generally parallel long sides and a pair of generally parallel short sides. The irradiating means comprises a source of radiation of generally cylindrical outline having a length large in relation to the diameter thereof. The central axis of the source of radiation is located a first predetermined distance above the area and spaced parallel to the long sides thereof. A pair of radiation absorbent surfaces is provided, each having a lower edge adjacent to a respective long side of the area along the length thereof and each having an upper edge adjacent the source of radiation, the lower edges of the pair of first radiation absorbent surfaces are spaced apart by a second predetermined distance. A plurality of pairs of second radiation absorbent surfaces is provided, each second radiation absorbent surface being orthogonal to the planar surface and located between the pair of first radiation absorbent surfaces. Each of the second radiation abosrbent surfaces has a lower edge adjacent said area and an upper edge adjacent the source of radiation. The lower edges of the pair of second radiation absorbent surfaces are spaced apart by a third predetermined distance. Each pair of second radiation absorbent surfaces form with portions of the surfaces of the first pair of radiation absorbent surfaces included therebetween a respective cell, each cell overlying a respective portion of the area, and each cell subtending a respective segment of the source of radiation.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings in which:

FIG. 1 is a plan view of apparatus in accordance with the present invention.

FIG. 2 is a front view of the apparatus of FIG. 1.

FIG. 3 is a sectional view of a portion of the apparatus of FIG. 1 taken along section lines 3—3 thereof.

FIG. 4 is a sectional view of a portion of the apparatus of FIG. 1 taken along section lines 4—4.

FIG. 5 shos a modification of the apparatus of FIG. 1 including the addition of reflectors.

Referring now to FIGS. 1 and 2, there are shown plan and front views of apparatus 10 in accordance with the present invention. The apparatus includes a table 11 including a planar top member 12 supported on a pair of side members 13 and 14. Overlying the top member 12 there is provided a continuous belt member 15 which is supported at one end of the apparatus by drum 16 mounted to side members 13 and 14 and supported at the other end by drum 17 also mounted to side members 13 and 14. The belt member 15 is a continuous belt the upper portion of which has a planar surface adapted to support objects to be irradiated, such as semiconductor wafers. The belt is adapted to be moved by rotation of the drum 17 by means of a motor 18 coupled thereto by a belt and pulley arrangement 19. Irradiation of the planar surface of the belt member lying over the top member 12 is provided by a lamp assembly 20 comprising a plurality of linear light sources 21, 22, 23 and 24. Conveniently in the embodiment of FIGS. 1 and 2 only four such radiation sources are shown. The lamp assembly includes cradle members 26 and 27 spaced above the top member 12 by adjustable support members 28. Cradle members 26 and 27 include aligned recesses 29 in which each of the linear light sources 21-24 are supported. Each of the light sources 21-24 is substantially identical and provides a source of radiation of generally cylindrical outline having a length large in relation to the diameter thereof. One such radiation source is the lamp described and claimed in the aforementioned U.S. Pat. No. 3,657,590 which is incorporated herein by reference thereto. This lamp comprises a cylindrical envelope in which a pair of electrodes are provided at the ends thereof and in which is included cadmium vapor at low pressure. On application of suitable electrical potentials to the electrodes, an arc is produced between the electrodes having a cylindrical outline of a diameter less than the diameter of the outer envelope. Such lamps are useful in that they provide radiation of wavelengths utilized in the processing of semiconductor devices, as described above, for example, in the band of 200-230 nanometers. The central axes of the lamps and of the glow discharge produced thereby are located in a plane parallel to the planar surface of the belt member 15 and spaced a first predetermined distance $d_1$, (FIGS. 3 and 4) therefrom. All of the central axes of the lamps are parallel and each lamp is spaced the same distance from an adjacent lamp.

A baffle assembly 35 is provided between the plane of the central axes of the linear light sources 21-24 and the planar surface of the belt 15 to be irradiated. The baffle assembly 35 is supported on a pair of brackets 36 and 37, one on each side of the baffle assembly. The brackets 36 and 37 are supported on the top member 12 by adjustable posts 38. The baffle assembly 35 includes a plurality of divider members 41-45 orthogonal to the plane of the surface of the top member 12 and parallel to the axes of the light sources 21-24. Divider members 41 and 42 are equally spaced by a distance $d_2/2$ in a direction orthogonal to the axis of the light source 21 to provide a compartment 51 which confines the light emitted by source 21 to an area of the surface of the belt 15 lying thereunder. The surfaces of the compartment 51 are made radiation absorbent, for example by blackening thereof. Accordingly, only the light directly emitted from the light source 21 impinges on the surface of the belt 15 underlying tthe compartment 51. Similarly, divider members 42 and 43 are equally spaced by distance $d_2/2$ from the axis of the light source 22 to provide compartment 52, divider members 43 and 44 are equally spaced by distance $d_2/2$ from the axis of light source 23 and provide compartment 53, and divider members 44 and 45 are equally spaced by distance $d_2/2$ from the axis of light source 24 to provide compartment 54. The surfaces of the compartments 52, 53 and 54 are also made radiation absorbent. Accordingly, substantially only direct light from sources 22, 23 and 24 impinges on the surface of the belt underlying respective compartments 52, 53 and 54. The divider members 41-45 having bottom edges 55 located adjacent the surface of the belt 15 and having the top edges 56 thereof located adjacent the light sources confine the radiation directed downward from the light sources 21-24 to a region of the surface of the top member 12 and the portion of the belt lying thereover circumscribed by the lines $a_1a_5$, $a_5b_5$, $b_5b_1$, and $b_1a_1$. The region $a_1a_5b_5b_1$ is divided in four substantially identical rectangular areas $a_1a_2b_2b_1$, $a_2a_3b_3b_2$, $a_3a_4b_4b_3$, and $a_4a_5b_5b_4$. Each of these areas have a pair of parallel long sides and a pair of parallel short sides.

Each of the compartments 51-54 is further divided into cells 57 by the provision of a plurality of spacer members 58 in each of the compartments. Each of the spacer members 58 is perpendicular to the planar surface of the top member 12 and the belt 15 and to the central axes of the overlying light sources 21-24. Each of the spacers 58 has a lower edge 59 located adjacent the surface area of the belt and has an upper edge 61 located adjacent the light sources. The spacers 58 are equally spaced by distance $d_3$ along the length of the compartment. Corresponding spacers of adjacent compartments are aligned as shown. The surfaces of the spacers are made radiation absorbent. Accordingly, only direct radiation from a light source impinges on the surface of the belt 15 underlying a cell.

The baffle assembly 35 may be made of a suitable material, such as aluminum, in sheet form. To provide the radiation absorbent surfaces the aluminum divider and spacer members may be sandblasted, anodized to form an oxide thereon and then impregnated with a suitable radiation absorbent dye.

Reference is now made to FIG. 3 which shows a cross sectional view of a cell 58 taken along section lines 3—3 of FIG. 1. The maximum angle $\theta_1$ of incidence of light from the source 21, as measured from a normal to the surface of the belt upon the surface of the belt, is approximately the arctangent $d_2/2d_1$, where $d_2/2$ is the spacing of a compartment divider from the axis of the light source 21, and $d_1$ is the distance of the axis of the light source from the surface of the belt. The intensity of radiation falling on the area underlying a cell is greatest at the center of a line directly underlying the axis of the light source 21. The intensity of light falling on a particular point of the surface decreases with distance from this point.

Reference is now made to FIG. 4 which shows a cross-sectional view of a cell of the baffle assembly of FIG. 1 taken along section lines 4—4 of FIG. 1. The maximum angle $\theta_2$ of incidence of light from source 21 as measured from a normal to the surface of the belt is approximately the arc tangent $d_3/d_1$, where $d_3$ is the spacing between spacers 58 of a cell and $d_1$ is the distance of the axis of the light source from the surface of the belt. If $d_2/2$ is equal to $d_3$ then the maximum angle of incidence as measured in a plane perpendicular to the axis of the light source and the maximum angle of incidence as measured in a plane including the axis of the light source are substantially identical. The maximum intensity of light in a direction measured along the direction of the axis of the light source would be maximum at the center of the cell and the minimum at the ends thereof. The angle of incidence of radiation in the corner of the cells would be a little greater than the angles $\theta_1$ and $\theta_2$. However, with the construction of individual cells as set forth in FIG. 1, the maximum angle of incidence of radiation from the light source on the surface of the belt is substantially limited to the angles $\theta_1$ and $\theta_2$. The provision of a baffle assembly of the character described with a plurality of cells, in addition to limiting the angle of incidence of radiation on the surface of the belt, has the effect of providing radiation on the surface of the belt which is more uniform.

In the utilization of the apparatus, not only is the angle of incidence of the radiation significant but also the uniformity of the dosage of radiation applied over a wafer and applied to a plurality of wafers located in different positions on a moving belt is significant. Not only does the intensity of radiation vary within a cell, as pointed out above, but the divider members and the spacer members have a finite width which shades portions of the surface lying thereunder. Accordingly, in order to provide each portion of a wafer with the same dosage of radiation, and also different wafers with the same dosage, the movement of the belt is set so that each wafer undergoes the same exposure. This is accomplished by setting the angle $\theta_3$ (FIG. 1) of a set of aligned spacers 58 with respect to the direction of belt travel indicated by arrow 65 so that a point of the belt traveling from a position underlying the divider 41 or entrance divider to a point underlying the divider 45 or exit divider advances a distance $d_3$ or the width of a cell with respect to the divider assembly. Thus all points of a wafer are subject to a uniform dosage of radiation in their travel through the irradiated region on the moving belt as well as being subject to radiation of various angles of incidence. If desired, the angle $\theta_3$ could be set to advance a point of a wafer in its travel through the irradiated region by a multiple of the width of a cell.

Reference is now made to FIG. 5 which shows a modification of the apparatus of FIG. 1. The elements of the apparatus of FIG. 5 identical to the elements of the apparatus of FIG. 1 are identically designated. A reflector 63 is located over each of the lamps 21-24 to reflect radiation from the sources downward onto the surface of the belt. The reflectors 63 may take any of a number of forms, for example, the reflectors may be of parabolic cross section with the light source essentially located at the focus thereof. Thus, radiation from the upper portion of the light sources is directed generally normal to the surface of the belt.

In the operation of the apparatus of FIGS. 1-5, the light sources 21-24 are energized from a suitable source (not shown) to provide an irradiated region $a_1a_5b_5b_1$ on the surface of the belt of generally quadrangular outline. The motor 18 is energized from a suitable source (not shown) to cause the endless belt 15 to move in the direction indicated by the arrow 65 over the surface of the top member 12. Semiconductor wafers suitably prepared are placed along the width of the belt outside of the irradiated region. As the belt moves the wafers pass under the entrance divider 41 into the irradiated region $a_1a_5b_5b_1$, are subject to radiation while in this region, and eventually emerge from underneath the exit divider 45. As explained above, each wafer receives substantially the same dosage of radiation and each portion of each wafer receives essentially the same dosage of radiation. To increase the dosage applied to irradiated objects or wafers the belt could be moved slower or additional lamps and baffle assembly cells could be provided. To increase the number of objects or wafers irradiated in a given time period, the belt speed could be increased. Correspondingly, additional lamps and baffle assembly cells could be provided to maintain the same dosage if desired. Of course, if it is desired to apply the radiation in a controlled atmosphere, for example nitrogen, a hood could be readily provided over the lamp, baffle assembly and belt.

While the lamp assembly was placed such that the axis of the lamps 21-24 lie generally transverse to the direction of belt travel, if desired, the assembly may be set so that the axes of the lamps are generally in line with the direction of belt travel. In the latter case, variations in the level of radiation of the lamp sources would not provide uniform dosage of radiation to wafers or substrates located along the width of the belt. In the embodiment shown in connection with FIG. 1, each lamp provides substantially uniform radiation along the length thereof. Thus, substrates, located along the width of the belt pass under each of the lamps and receive the same dosage even though radiation intensity may vary from lamp to lamp.

In the baffle assembly 35, the spacer elements 58 are located generally orthogonal to the divider members 41-45. If desired, the spacer members could be located at other angles. Also, the spacer members 58 in one compartment could be staggered with respect to the location thereof in another compartment, if desired.

In the baffle assembly 35 the compartments 51-54 are closely spaced. If desired, the compartments could be separated to provide illuminated areas separated by unilluminated areas.

While the invention has been described in a specific embodiment, it will be understood that modifications may be made by those skilled in the art, and it is intended by the appended claims to cover all such modifications and changes as fall within the true spirit and scope of the invention.

We claim:

1. In combination, means for providing a planar surface, means for irradiating an area of said surface, said area being of generally quadrangular outline and being bounded by a pair of generally parallel long sides and a pair of generally parallel short sides, said irradiation means comprising:

a source of radiation of generally cylindrical outline having a length large in relation to the diameter thereof, the central axis of said source of radiation being located at first predetermined distance above said area and spaced parallel to the long sides thereof, a pair of radiation first absorbent surfaces, each having a lower edge adjacent a respective long side of said area along the length thereof and each having an upper edge adjacent said source of radiation, the lower edges of said pair of first radiation absorbent surfaces spaced apart by a second predetermined distance, a plurality of pairs of second radiation absorbent surfaces, each second radiation absorbent surface being orthogonal to said planar surface and located between said pair of first radiation absorbent surfaces, each of said second radiation absorbent surfaces having a lower edge adjacent said area and an upper edge adjacent said source of radiation, the lower edges of said pair of second radiation absorbent surfaces spaced apart by a third predetermined distance, each pair of second radiation absorbent surfaces forming with portions of the surfaces of the first pair of radiation absorbent surfaces included therebetween a respective cell, each cell overlying a respective portion of said area, each cell subtending a respective segment of said source of radiation.

2. The combination of claim 1 in which each of said cells abuts an adjacent cell.

3. The combination of claim 1 in which
the maximum departure from normal incidence of radiation in each portion of said area in a direction orthogonal to said long sides is given by a first angle, the tangent of which is a first ratio substantially equal to one-half said second predetermined distance divided by said first predetermined distance, the maximum departure from normal incidence of radiation in each portion of said area in a direction parallel to said long sides being given by a second angle, the tangent of which is a second ratio substantially equal to said third predetermined distance divided by said first predetermined distance, setting said first angle substantially equal to said second angle.

4. The combination of claim 1 in which said source of radiation is equally spaced from the long sides of said area.

5. The combination of claim 1 in which said irradiating means includes a reflector spaced above said source of radiation for reflecting radiation from said source to said area.

6. The combination of claim 1 in which said source is a cadmium vapor source providing radiation in the range of about 200 to 230 nanometers.

7. In combination,
means for providing a planar surface,
means for irradiating a region of said planar surface, said region consisting of a plurality of substantially identical areas of generally quadrangular outline, each area being defined by a pair of generally parallel long sides and a pair of generally parallel short sides, the long sides of adjacent areas being closely spaced along the length thereof, said irradiating means including a plurality of radiation providing means, each of said radiation providing means providing radiation to a respective area, each of said radiation providing means comprising:
a source of radiation of generally cylindrical outline having a length large in relation to the diameter thereof, the central axis of said source of radiation being located a first predetermined distance above said area and spaced parallel to the long sides thereof, a pair of first radiation absorbent surfaces, each having a lower edge adjacent a respective long side of said area along the length thereof and each having an upper edge adjacent said source of radiation, the lower edges of said pair of first radiation absorbent surfaces spaced apart by a second predetermined distance, a plurality of pairs of second radiation absorbent surfaces, each second radiation absorbent surface being orthogonal to said planar surface and located between said pair of first radiation absorbent surfaces, each of said second radiation absorbent surfaces having a lower edge adjacent said area and an upper edge adjacent said source of radiation, the lower edges of said pair of second radiation absorbent surfaces spaced apart by a third predetermined distance, each pair of second radiation absorbent surfaces forming with portions of the surfaces of the first pair of radiation absorbent surfaces included therebetween a respective cell, each cell abutting an adjacent cell, each cell overlying a respective portion of said area, each cell subtending a respective segment of said source of radiation.

8. The combination of claim 7 in which said source of radiation is equally spaced from the long sides of said area.

9. The combination of claim 7 in which each of the second radiation absorbent surfaces of a cell of a radiation providing means is copolanar with a respective second radiation absorbent surface of an adjacent cell of an adjacent radiation providing means.

10. The combination of claim 7 in which said means providing said planar surface is a platform and in which means are provided for moving said platform in the plane of said planar surface in a direction generally parallel to said second radiation absorbent surfaces.

11. The combination of claim 10 in which the orientation of the first radiation absorbent surfaces with respect to the direction of movement of said planar surface is set so that a point on said belt in moving from a point under an initial first radiation absorbent surface to a point under a final first radiation absorbent surface advances with respect to said radiation providing means a distance equal to a multiple of said third predetermined distance.

12. The combination of claim 11 in which said multiple is one.

13. The combination of claim 7 in which each of said radiation providing means includes a reflector spaced above said source of radiation for reflecting radiation from said source to said area.

14. The combination of claim 7 in which said source is a cadmium vapor source providing radiation in the range of about 200 to 230 nanometers.

* * * * *